United States Patent
Landry et al.

(10) Patent No.: US 7,621,678 B2
(45) Date of Patent: Nov. 24, 2009

(54) ELECTROMAGNETIC RADIATION SHIELD FOR AN OPTICAL SUBASSEMBLY

(75) Inventors: Gary Landry, Allen, TX (US); Harold Y. Walker, Jr., Plano, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 12/125,748

(22) Filed: May 22, 2008

(65) Prior Publication Data

US 2008/0298750 A1    Dec. 4, 2008

Related U.S. Application Data

(60) Provisional application No. 60/941,214, filed on May 31, 2007.

(51) Int. Cl.
  *G02B 6/36* (2006.01)
(52) U.S. Cl. ............... 385/88; 250/515.1; 385/147
(58) Field of Classification Search .......... 385/88–94, 385/147; 361/800, 816, 818; 250/515.1
  See application file for complete search history.

(56) References Cited

U.S. PATENT DOCUMENTS

| | | | |
|---|---|---|---|
| 3,787,014 A | | 1/1974 | Story et al. |
| 4,227,765 A | * | 10/1980 | Neumann et al. .......... 439/248 |
| 4,891,020 A | | 1/1990 | Dunn |
| 5,852,257 A | | 12/1998 | Dittman et al. |
| 6,163,454 A | * | 12/2000 | Strickler .................... 361/695 |
| 6,407,932 B1 | * | 6/2002 | Gaio et al. ................. 361/818 |
| 6,474,876 B1 | * | 11/2002 | Sikorski, Jr. ................ 385/55 |
| 6,590,848 B1 | * | 7/2003 | Chen ......................... 720/654 |
| 6,744,639 B1 | * | 6/2004 | Branch et al. ............... 361/818 |
| 6,764,338 B2 | * | 7/2004 | Fang .......................... 439/607 |
| 7,111,994 B2 | * | 9/2006 | Schwiebert et al. .......... 385/92 |
| 7,229,295 B2 | * | 6/2007 | Ice et al. ...................... 439/79 |
| 2002/0012503 A1 | | 1/2002 | Kuhne |
| 2003/0156802 A1 | | 8/2003 | Togami |
| 2004/0037517 A1 | * | 2/2004 | Dair et al. .................... 385/92 |
| 2005/0283194 A1 | * | 12/2005 | Fluegel et al. ................ 607/2 |
| 2006/0045436 A1 | * | 3/2006 | Wang et al. .................. 385/92 |
| 2006/0098924 A1 | * | 5/2006 | Anderl et al. ................ 385/92 |
| 2006/0263013 A1 | * | 11/2006 | Sone .......................... 385/89 |
| 2007/0201798 A1 | | 8/2007 | Kramer et al. |

OTHER PUBLICATIONS

Teo et al., Electromagnetic Radiation Shield for an Optical Subassembly, U.S. Appl. No. 12/130,833, filed May 30, 2008.
Teo et al., Electromagnetic Radiation Shield for an Optical Subassembly, U.S. Appl. No. 12/130,843, filed May 30, 2008.
United States Patent and Trademark Office, U.S. Appl. No. 12/130,833, Office action mailed Dec. 19, 2008.
Amendment "A" and Response to Office action mailed Dec. 19, 2008, U.S. Appl. No. 12/130,833, response filed May 19, 2009.

\* cited by examiner

*Primary Examiner*—Ellen Kim
(74) *Attorney, Agent, or Firm*—Workman Nydegger

(57) ABSTRACT

In one example embodiment, an electromagnetic radiation (EMR) shield includes a disk, and a substantially centrally located opening defined in the disk. An outside perimeter of the disk is approximately the same as that of a flange of an associated optical subassembly (OSA). The disk defines a plurality of apertures.

8 Claims, 7 Drawing Sheets

ELECTROMAGNETIC RADIATION SHIELD FOR AN OPTICAL SUBASSEMBLY

CROSS-REFERENCE TO A RELATED APPLICATION

The present application claims priority from U.S. Provisional Patent Application Ser. No. 60/941,214, filed May 31, 2007 and entitled "Electromagnetic Radiation Shield for an Optical Subassembly," which is incorporated herein by reference in its entirety.

BACKGROUND

Optoelectronic modules, such as optoelectronic transceiver or transponder modules, are increasingly used in electronic and optoelectronic communication. Optoelectronic modules generally include one or more optical subassemblies (OSAs), such as a transmitter optical subassembly (TOSA) and/or a receiver optical subassembly (ROSA). Each OSA of an optoelectronic module is generally positioned proximate an optical port of the optoelectronic module. Each optical port is configured to receive an optical fiber connector, such as an LC or an SC connector, such that the corresponding optical fiber is capable of optically and mechanically interfacing with the OSA.

Optoelectronic modules also generally include one or more printed circuit boards having electronic circuitry. The electronic circuitry of a printed circuit board can create electromagnetic radiation (EMR). When EMR is inadvertently emitted from an optoelectronic module, the EMR can cause electromagnetic interference (EMI) in nearby electronic devices which can degrade the functionality of those electronic devices. Therefore, it is important to control the inadvertent emission of EMR from optoelectronic modules. In addition, as host devices are configured to simultaneously interface with increasing numbers of optoelectronic modules, and as data rates of optoelectronic modules increase, the inadvertent emission of EMR becomes increasingly problematic.

Another related problem is the electromagnetic susceptibility (EMS) of optoelectronic modules. The EMS of an optoelectronic module is the degree to which the optoelectronic module is subject to malfunction or failure under the influence of electromagnetic radiation. Therefore, it is also important to control the inadvertent introduction of EMR into optoelectronic modules.

Controlling the emission/introduction of EMR from/into an optoelectronic module is generally accomplished by surrounding the optoelectronic module, as much as possible, with a housing formed from an electrically conductive material, which limits the emission/introduction of EMR, thus decreasing EMI in nearby electronic devices and in the optoelectronic module. It can be difficult, however, to control the transmission of EMR through required openings in the housing of an optoelectronic module, such as the optical ports that are configured to receive optical fiber connectors.

As mentioned above, each OSA in an optoelectronic module is generally positioned proximate an optical port of the optoelectronic module. Each OSA is generally formed from a non-electrically conductive material, such as plastic, and is therefore not effective at limiting the transmission of EMR. EMR may, therefore, pass through the OSA and exit and/or enter the optoelectronic module through the corresponding optical port.

Attempts have been made to control the amount of EMR that passes through an OSA. One such attempt involved shielding a plastic OSA by coating the OSA with metal. This attempt proved problematic, however, due to the increased effort required to securely adhere metal to the plastic OSA, which resulted in the metal coating flaking off, thus decreasing the effectiveness of the shielding. This attempt also failed to address the large hole in the shielding where the OSA interfaces with an optical fiber.

Another attempt at controlling the amount of EMR that passes through an OSA involved forming the OSA from metal instead of plastic. This attempt also proved problematic because of the increased cost in manufacturing a metal OSA over a plastic OSA. This attempt also failed to address the large hole in the shielding where the OSA interfaces with an optical fiber.

In light of the above discussion, a need currently exists for an OSA that is effective at limiting the transmission of EMR out of and/or into an optoelectronic module into which the OSA is integrated.

BRIEF SUMMARY OF SOME EXAMPLE EMBODIMENTS

In general, example embodiments of the invention relate to an electromagnetic radiation (EMR) shield for an optical subassembly (OSA). In some example embodiments, the example EMR shields disclosed herein can aid in the control of the amount of EMR that passes through OSAs into which the EMR shields are integrated. These example OSAs can, in turn, be effective at limiting the transmission of EMR out of and/or into optoelectronic modules into which the OSAs are integrated. These example OSAs can be effective at limiting the transmission of EMR while avoiding the difficulties and costs associated with coating OSAs with metal or forming OSAs from metal.

In one example embodiment, an EMR shield includes a disk, and a substantially centrally located opening defined in the disk. An outside perimeter of the disk is approximately the same as that of a flange of an associated OSA. The disk defines a plurality of apertures.

In another example embodiment, an OSA includes a receptacle, a neck extending from the receptacle, a flange extending from the neck, a barrel extending from the flange and defining a cavity, and an EMR shield at least partially embedded in the flange. The EMR shield includes a disk and a substantially centrally located opening defined in the disk. The disk defines a plurality of apertures. The diameter of the opening is smaller than the diameter of the cavity.

In yet another example embodiment, an EMR shield includes a base, first and second disks extending from the base, and an opening defined by and extending through the first disk, the base, and the second disk. The base defines a plurality of apertures and each disk defines a plurality of apertures. The outside perimeter of the first disk is approximately the same as that of a flange of an associated OSA.

BRIEF DESCRIPTION OF THE DRAWINGS

To further clarify certain aspects of the present invention, a more particular description of the invention will be rendered by reference to example embodiments thereof which are disclosed in the appended drawings. It is appreciated that these drawings depict only example embodiments of the invention and are therefore not to be considered limiting of its scope. Aspects of the invention will be described and explained with additional specificity and detail through the use of the accompanying drawings in which.

DETAILED DESCRIPTION OF SOME EXAMPLE EMBODIMENTS

Example embodiments of the present invention relate to electromagnetic radiation (EMR) shields for use in optical subassemblies (OSAs), such as transmitter optical subassemblies (TOSAs) and/or receiver optical subassemblies (ROSAs). The example EMR shields disclosed herein can aid in controlling the amount of EMR that passes through OSAs in connection with which the EMR shields are employed. These OSAs can, in turn, be effective at limiting the transmission of EMR out of and/or into optoelectronic modules into which the OSAs are integrated, while avoiding the difficulties and costs associated with approaches such as coating OSAs with metal, or forming OSAs from metal.

Reference will now be made to the drawings to describe various aspects of example embodiments of the invention. It is to be understood that the drawings are diagrammatic and schematic representations of such example embodiments, and are not limiting of the present invention, nor are they necessarily drawn to scale.

1. Example Optoelectronic Module

Figure 1:
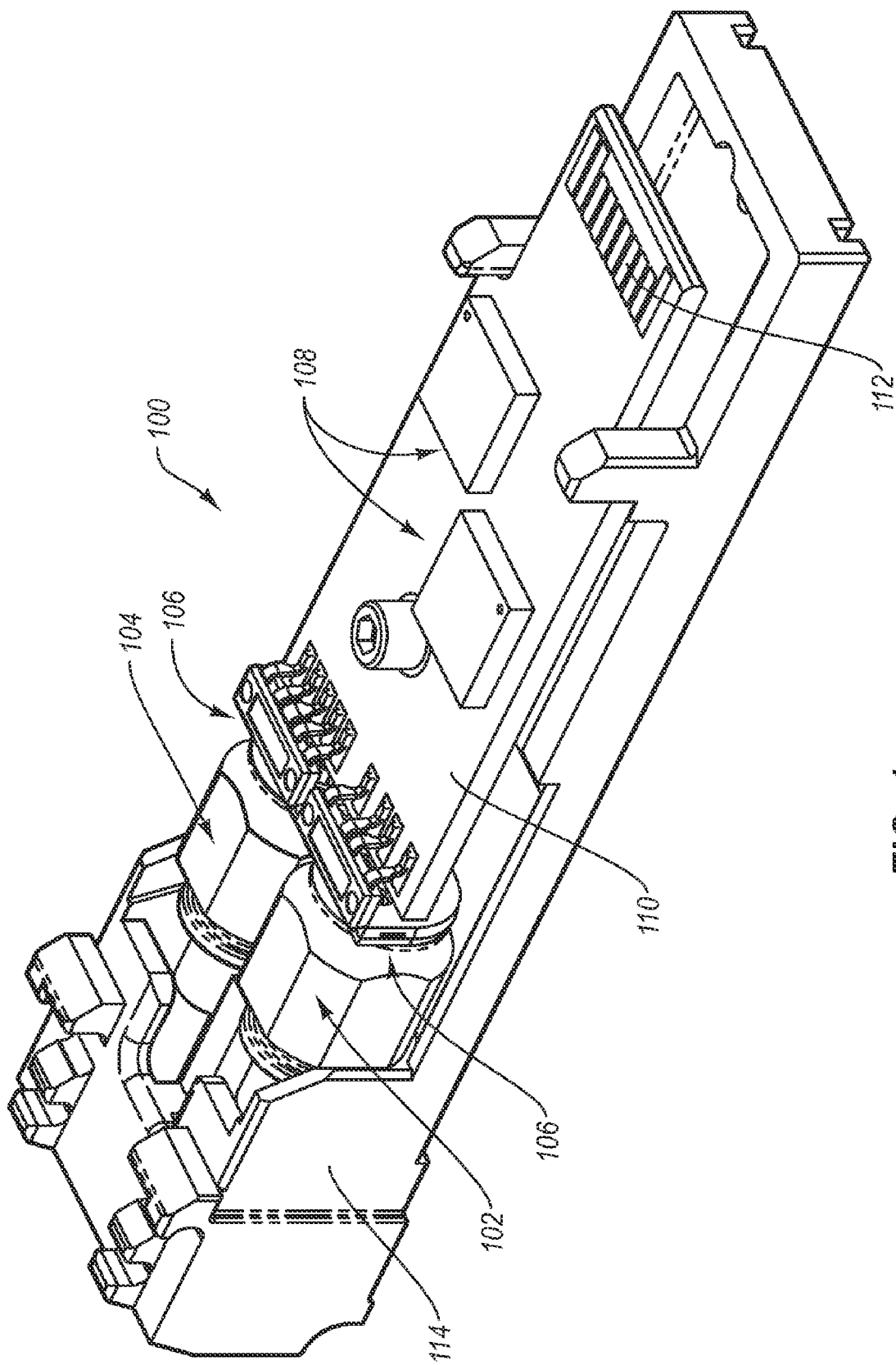
FIG. 1 is a perspective view of an example optoelectronic module.

Reference is first made to FIG. 1, which is a perspective view of an example optoelectronic module, generally designated at 100, for use in transmitting and receiving optical signals in connection with one or more other devices, such as an external host device (not shown). The optoelectronic module 100 is one environment in which example embodiments of the invention can be practiced. As disclosed in FIG. 1, the optoelectronic module 100 includes various components, including a ROSA 102, a TOSA 104, electrical interfaces 106, and various electronic components 108 of a printed circuit board ("PCB") 110.

An edge connector 112 is located on an end of the PCB 110 to enable the optoelectronic module 100 to electrically interface with a host device (not shown). As such, the PCB 110 facilitates electrical communication between the ROSA 102/TOSA 104 and the host device. In addition, the above-mentioned components of the optoelectronic module 100 are partially housed within a shell 114. The shell 114 can cooperate with a cover portion (not shown) to comprise a housing for the components of the optoelectronic module 100.

The optoelectronic module 100 can be configured for optical signal transmission and reception at a variety of per second data rates including, but not limited to, 1 Gbit, 2 Gbit, 2.5 Gbit, 4 Gbit, 8 Gbit, 10 Gbit, 10.3 Gbit, 10.5 Gbit, or higher. Further, the optoelectronic module 100 can be configured for optical signal transmission and reception at various wavelengths including, but not limited to, 850 nm, 1310 nm, 1470 nm, 1490 nm, 1510 nm, 1530 nm, 1550 nm, 1570 nm, 1590 nm, or 1610 nm. Also, the optoelectronic module 100 can be configured to support various communication protocols including, but not limited to, Fast Ethernet, Gigabit Ethernet, 10 Gigabit Ethernet, and 1×, 2×, 4×, and 10× Fibre Channel. Further, the optoelectronic module 100 can be configured to operate at various temperature ranges including, but not limited to, 0° C. to 70° C. In addition, the optoelectronic module 100 can be configured to assume a variety of different form factors that are substantially compliant with various transceiver and/or transponder MSAs including, but not limited to, SFF, SFP, XFP, XPAK, X2, or XENPAK.

With continued reference to FIG. 1, the ROSA 102 houses an optical receiver such as a photodiode (not shown) that is electrically coupled to one of the electrical interfaces 106. The TOSA 104 similarly houses an optical transmitter such as a laser (not shown) that is electrically coupled to the other electrical interface 106. The optical receiver is configured to convert optical signals received through an optical port (not shown) into corresponding electrical signals that are relayed to the PCB 110. The optical transmitter is configured to convert electrical signals received through the PCB 110 from a host device (not shown) into corresponding optical signals that are transmitted through an optical port (not shown). Accordingly, the ROSA 102 serves as an optical-electronic transducer and the TOSA 104 serves as an electronic-optical transducer. The optical ports (not shown) are configured to optically connect the optical transmitter and the optical receiver with optical fiber connectors such as LC or SC connectors (not shown) that are connected to the optical ports.

Having described a specific environment with respect to FIG. 1, it will be understood that this specific environment is only one of countless architectures in which example embodiments of the present invention may be employed. The scope of the present invention is not intended to be limited to any particular environment.

2. Example OSA Having an Example EMR Shield

Figure 2A:
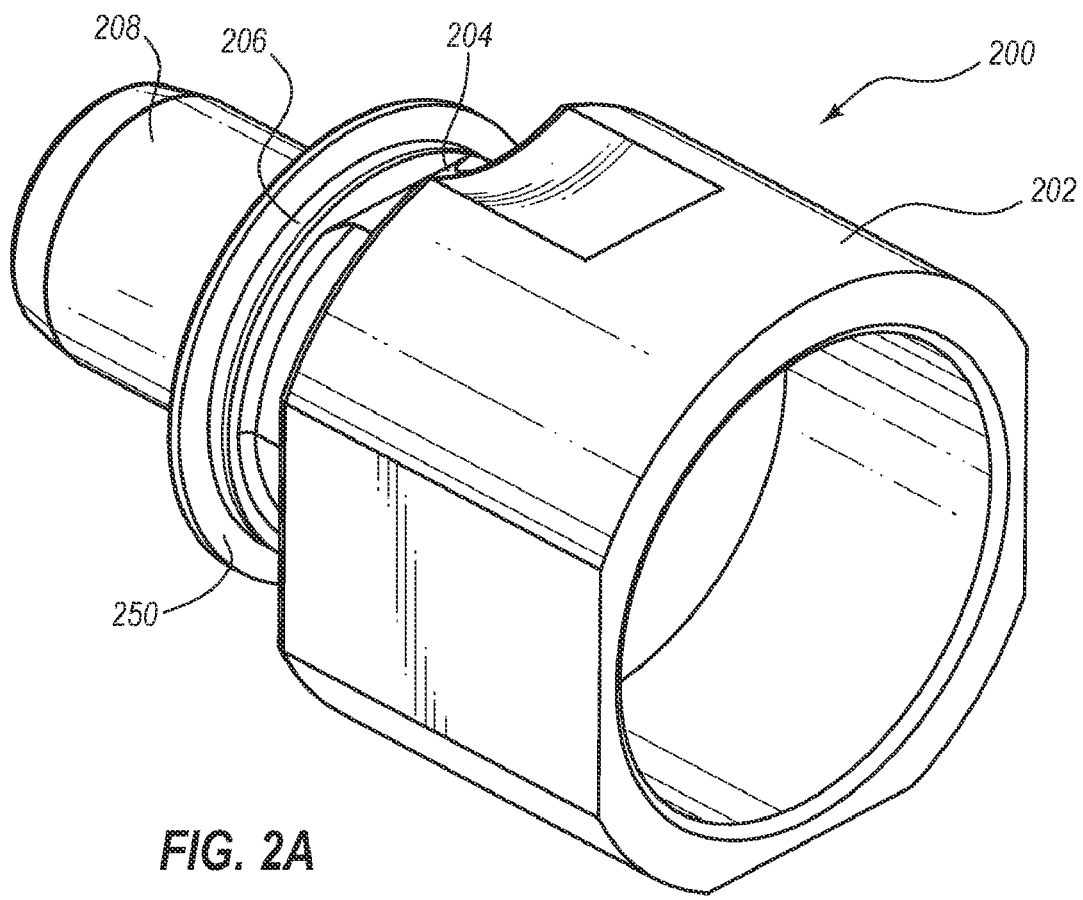
FIG. 2A is a perspective view of part of an example optical subassembly (OSA) including an example electromagnetic radiation (EMR) shield.

With reference now to FIGS. 2A-2D, an example OSA including an example EMR shield is disclosed. With particular reference first to FIG. 2A, the example OSA, denoted generally at 200, includes a receptacle 202, a neck 204 extending from the receptacle 202, a flange 206 extending from the neck 204, and a barrel 208 extending from the flange 206. In one example embodiment, the receptacle 202, neck 204, flange 206, and barrel 208 of the OSA 200 are formed from an optically transmissive plastic material that is molded into the shape disclosed in FIG. 2A.

Figure 2B:
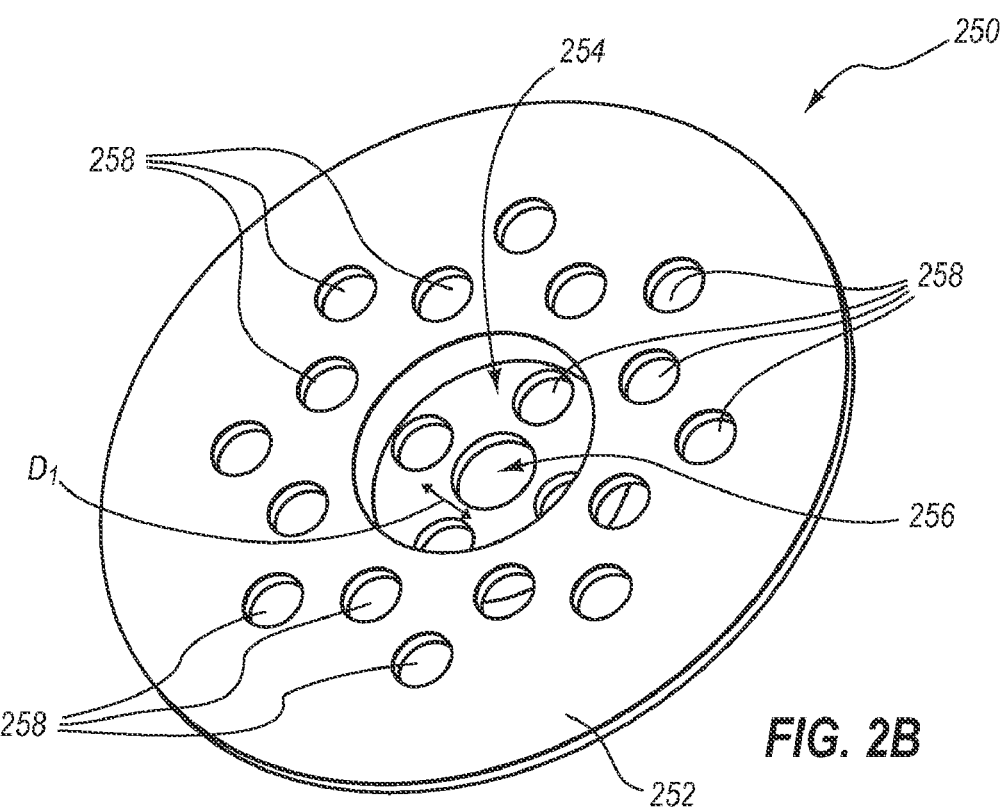
FIG. 2B is a perspective view of the example EMR shield of FIG. 2A.
Figure 2C:
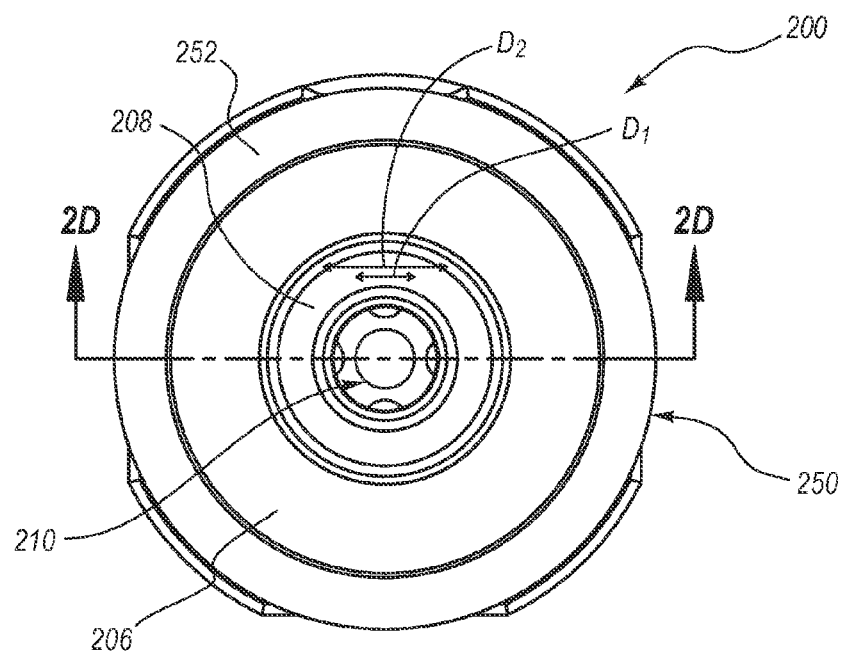
FIG. 2C is a front view of the example OSA of FIG. 2A.
Figure 2D:
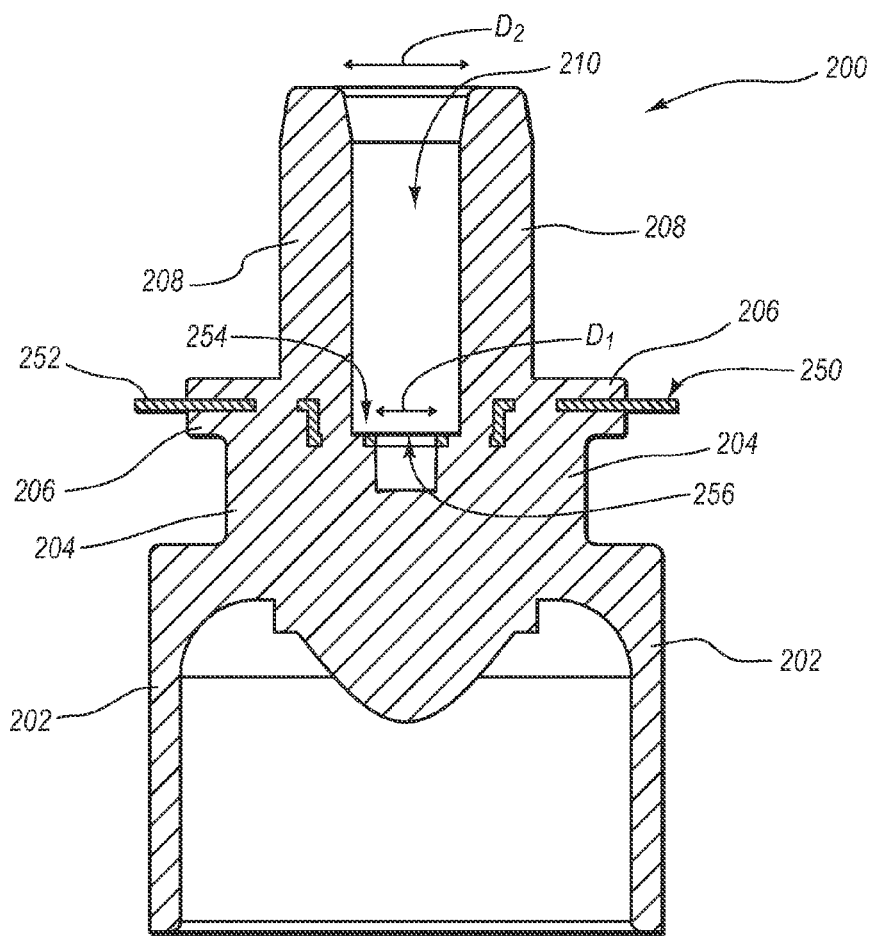
FIG. 2D is a cross-sectional view of the example OSA of FIG. 2C.

With continuing reference to FIG. 2A, the example OSA 200 also includes an example EMR shield 250 that is partially embedded in the flange 206 (also see FIG. 2D). With particular reference now to FIG. 2B, the example EMR shield 250 includes a disk 252, an optional substantially centrally located indentation 254 defined in the disk 252, and a substantially centrally located opening 256 defined in the indentation 254. The opening 256 has a diameter $D_1$ that will be discussed in greater detail below in connection with FIGS. 2C-2D. In one example embodiment, the EMR shield 250 can be stamped from a material that is effective at controlling passage of EMR, such as stainless steel sheet metal. In other example embodiments, it is understood that the EMR shield 250 can be formed using other processes from other materials that are effective at controlling passage of EMR.

Although the disk 252 is substantially circular, it is understood that the disk 252 may instead have another shape including, for example, triangular, rectangular, or polygonal. In some example embodiments, the perimeter of the disk 252 may substantially conform to a cross-sectional perimeter of an OSA into which the disk 252 is embedded. For example, the outside perimeter of the disk 252 may be approximately the same as the outside perimeter of the flange 206 into which the disk 252 is embedded.

With continuing reference to FIG. 2B, the example EMR shield 250 also includes a plurality of apertures 258. During the manufacture of the example OSA 200, the EMR shield 250 is placed in a mold (not shown) and then a liquid or semi-liquid optically transmissive plastic material is injected into the mold. The apertures 258 of the EMR shield 250 are sized and configured such that during the molding of the OSA 200, the apertures 258 allow the plastic material from which the OSA 200 is molded to flow through the apertures 258 to all portions of the mold without materially impeding the flow of plastic. The apertures 258 thus enable the disk 252 of the EMR shield 250 to be partially embedded into the flange 206 of the OSA 200 during the molding of the OSA 200. A portion of the plastic material also remains positioned within the apertures 258 after the molding of the example OSA 200. The size, shape, orientation, location, and number of apertures 258 defined in the EMR shield 250 can be adjusted according to a variety of factors including, but not limited to, the data rate at which the OSA 200 communicates and the viscosity of the plastic from which the OSA 200 is molded.

With particular reference now to FIGS. 2C-2D, the barrel 208 of the OSA 200 defines a cavity 210 that is sized and configured to receive an optical fiber and/or an optical fiber ferrule. The cavity 210 has a diameter $D_2$. In the example embodiment disclosed in FIG. 2C-2D, the diameter $D_1$ of the opening 256 of the EMR shield 250 is smaller than the diameter $D_2$ of the cavity 210 of the OSA 200. Although the second diameter $D_2$ of the cavity 210 of the OSA 200 must be large enough to receive an optical fiber and/or an optical fiber ferrule, the core of the optical fiber is generally smaller in diameter than the second diameter $D_2$ due to the presence of various cladding layers surrounding the core of the optical fiber and/or the optical fiber ferrule surrounding the core. Therefore, where the diameter $D_1$ is smaller than the diameter $D_2$, the EMR shield 250 can help control the transmission of EMR without materially impeding the transmission of optical signals between the core of an optical fiber received in the cavity 210 and the transducer housed in the receptacle 202. The relatively smaller size of the diameter $D_1$ of the opening 256 can increase the effectiveness of the EMR shield 250 by effecting a relative reduction in the amount of EMR that can escape through the cavity 210 of the OSA 200. The relatively smaller size of the diameter $D_1$ of the opening 256 can also increase the effectiveness of the EMR shield 250 by effecting a relative reduction in the amount of EMR that can enter the OSA 200 through the cavity 210.

As disclosed in FIG. 2D, the EMR shield 250 can be employed in OSAs such as the OSA 200 where an innermost end of the cavity 210 extends beyond the barrel 208 into the flange 206. The indentation 254 of the EMR shield 250 can enable the EMR shield 250 to be embedded in the OSA 200 without reducing the length of the cavity 210. In alternative embodiments where the innermost end of the cavity 210 does not extend beyond the barrel 208 into the flange 206, the indentation 254 may be unnecessary and the disk 252 of the EMR shield 250 can be substantially planar. It is understood that an EMR shield can be shaped however necessary to accommodate a particular OSA geometry. Therefore, the configurations of the EMR shield 250 and the EMR shield 350 (disclosed below in connection with FIGS. 3A-3F) are to be considered exemplary and not limiting.

Also, once the example EMR shield 250 is partially embedded into the flange 206 of the example OSA 200, a portion of the disk 252 of the EMR shield 250 can extend beyond the outside perimeter of the flange 206, as disclosed in FIG. 2D. This portion of the disk 252 that extends beyond the outside perimeter of the flange 206 can electrically communicate with a grounded housing of an optoelectronic module (not shown) into which the OSA 200 is integrated. In one embodiment, for example, the disk 252 electrically communicates through physical contact with a grounded housing of an optoelectronic module (not shown) into which the OSA 200 is integrated. Grounding the EMR shield 250 can further enhance the effectiveness of the EMR shield 250.

3. Another Example OSA Having Another Example EMR Shield

With reference now to FIGS. 3A-3F, another example OSA including another example EMR shield is disclosed. As disclosed in FIGS. 3A and 3B, the example OSA, denoted generally at 300, includes a receptacle 302, a neck 304, a flange 306, and a barrel 308, each of which is molded from an optically transmissive plastic material in this embodiment. The example OSA 300 also includes a cavity 310 defined in the barrel 308 that is configured to receive an optical fiber and/or an optical fiber ferrule. The example OSA 300 also includes an example EMR shield 350 that is partially embedded in the receptacle 302, the neck 304, and the flange 306 of the OSA 300.

Figure 3A:
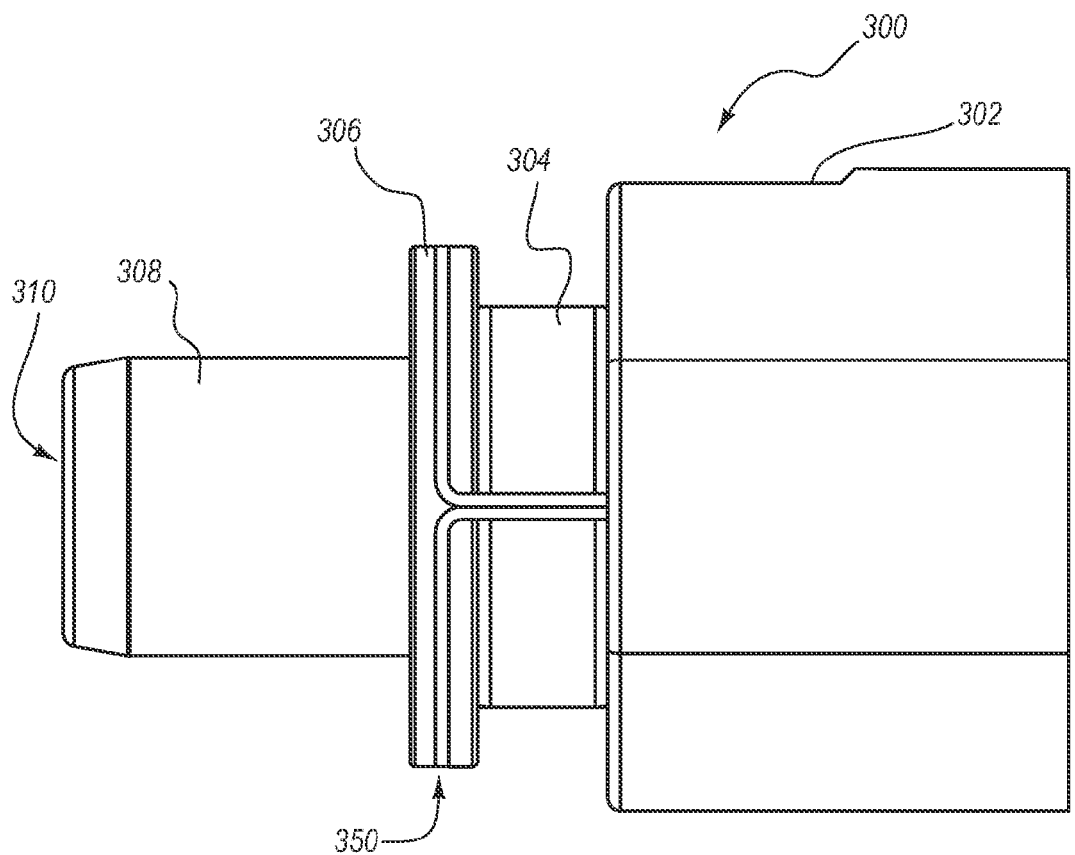
FIG. 3A is a side view of part of another example OSA including another example EMR shield.
Figure 3B:
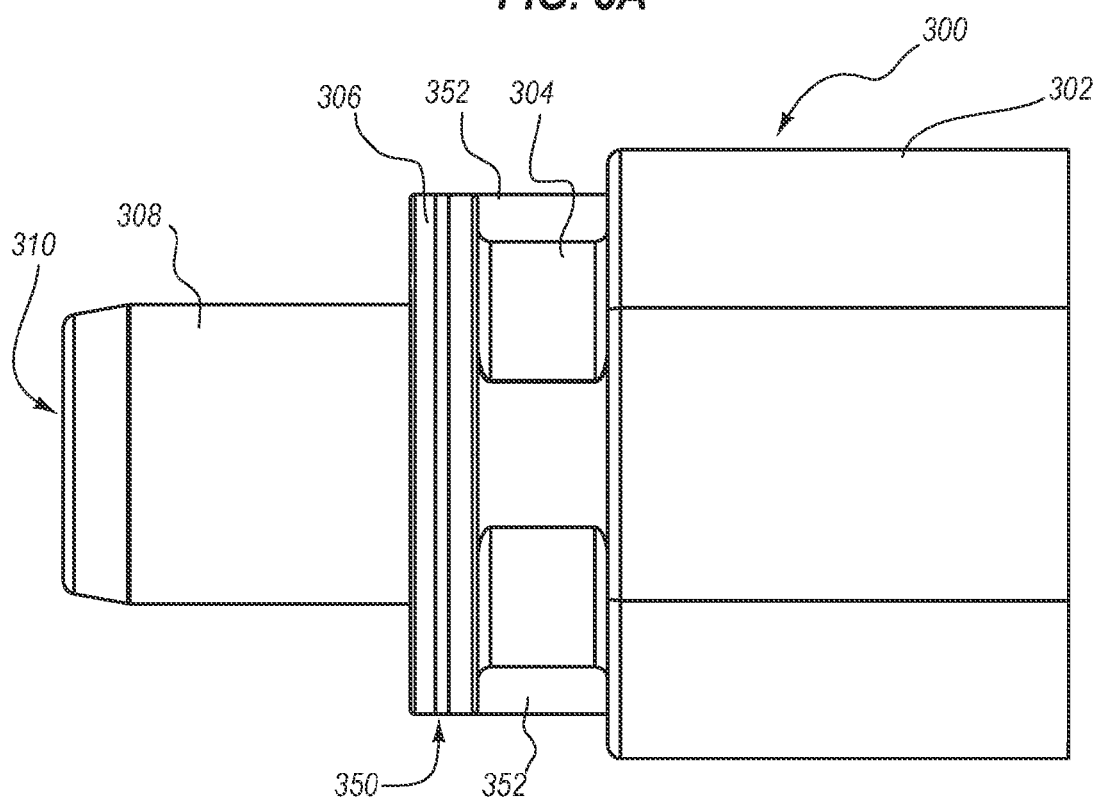
FIG. 3B is a top view of the example OSA of FIG. 3A.
Figure 3C:
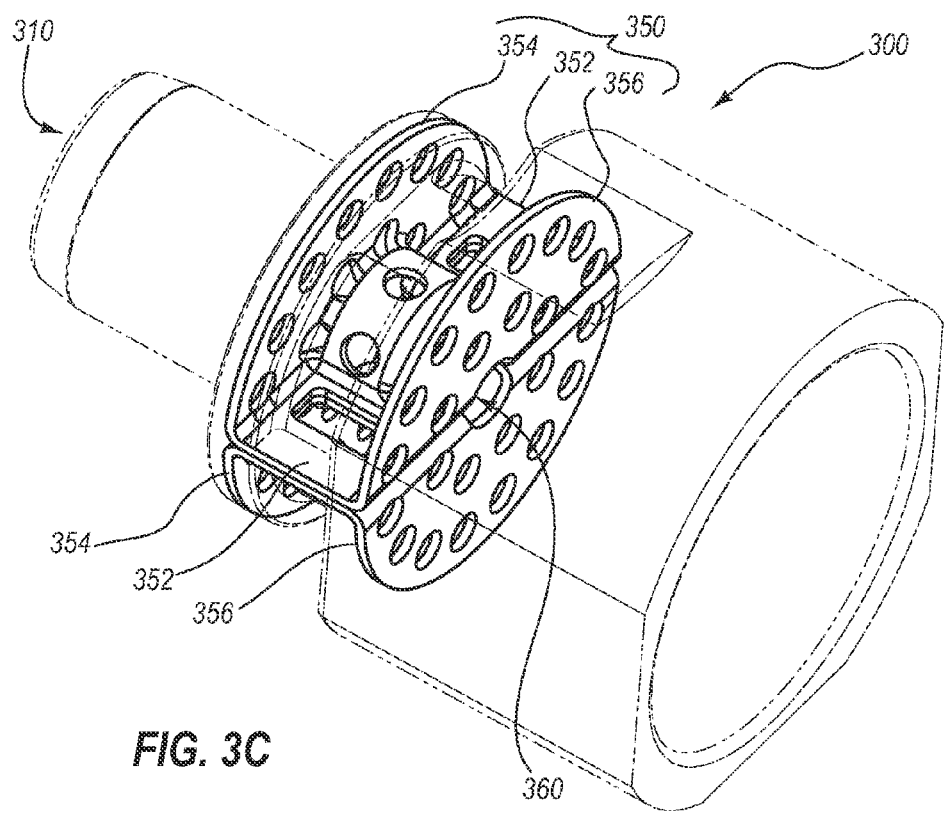
FIG. 3C is a semi-transparent perspective view of the example OSA of FIGS. 3A and 3B.
Figure 3D:
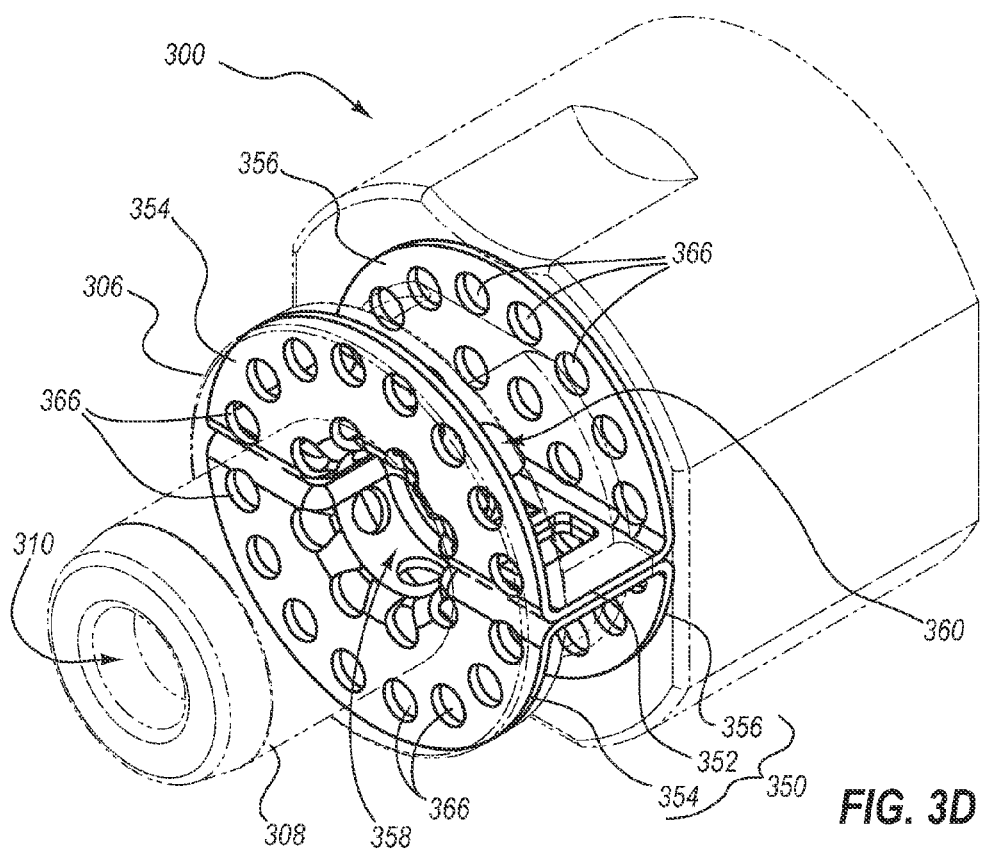
FIG. 3D is another semi-transparent perspective view of the example OSA of FIGS. 3A and 3B.

With particular reference now to FIGS. 3C and 3D, the example EMR shield 350 comprises several composite components including a base 352, a first disk 354 extending from the base 352, and a second disk 356 extending from the base 352. As disclosed in FIGS. 3A-3D, the outside perimeter of the first disk 354 in this example is approximately the same as that of the flange 306 into which the first disk 354 is embedded.

In the embodiment disclosed in FIGS. 3C and 3D, the above listed components 352, 354, and 356 of the EMR shield 350 are composite components formed from substantially identical top and bottom pieces that are attached together, although one or more of the above listed components 352, 354, and 356 may alternatively be formed from non-identical top and bottom pieces, or three or more pieces. For example, as disclosed in FIG. 3E, the EMR shield 350 is formed from two separate half-shields 362 and 364 that are each stamped from a material that is effective at controlling passage of EMR, such as stainless steel sheet metal, although it is understood that the half-shields 362 and 364 can be formed using other processes from other materials that are effective at controlling passage of EMR. The half-shields 362 and 364 can then be welded or otherwise attached together at the base 352. However, in an alternative embodiment, the EMR shield 350 could be formed as a single integral piece.

With continuing reference to FIGS. 3C and 3D, an optional indentation 358 is defined in the first disk 354, and an opening 360 is defined by and extends through the indentation 358, the base 352, and the second disk 356. With continuing reference to FIG. 3D, the EMR shield 350 can be employed in OSAs such as the OSA 300 where an innermost end of the cavity 310 extends beyond the barrel 308 into the flange 306. The indentation 358 of the EMR shield 350 can enable EMR shield 350 to be embedded in the OSA 300 without reducing the length of the cavity 310. In alternative embodiments where the innermost end of the cavity 310 does not extend beyond the barrel 308 into the flange 306, the indentation 358 may be unnecessary and the first disk 354 can be substantially the same configuration as the second disk 356.

Figure 3E:
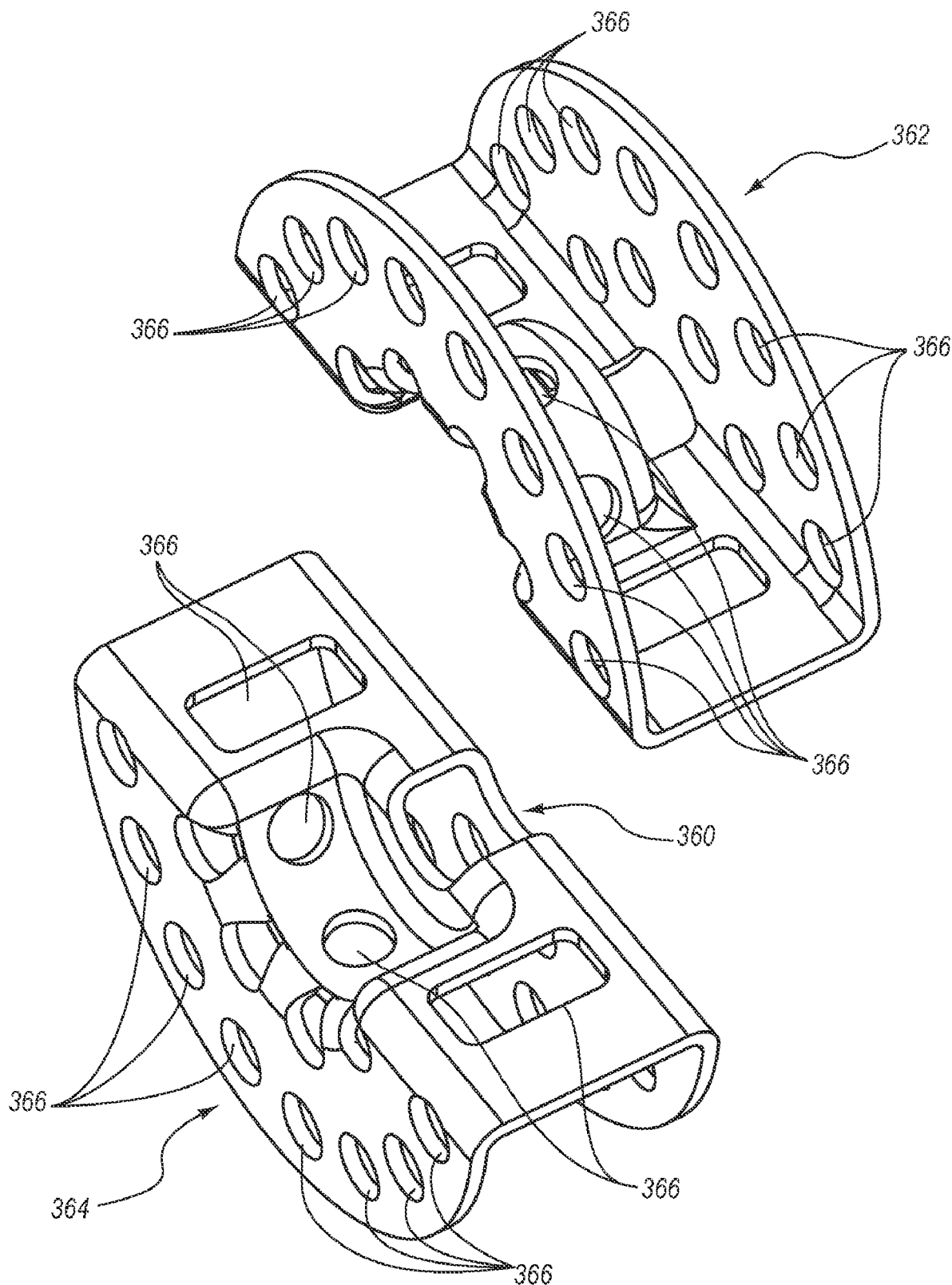
FIG. 3E is an exploded perspective view of the example EMR shield of FIGS. 3C and 3D.

With reference now to FIGS. 3C-3E, the example EMR shield 350 also includes a plurality of apertures 366 that are sized and configured similarly to the apertures 258 disclosed herein in connection with the EMR shield 200. During the manufacture of the example OSA 300, the EMR shield 350 is placed in a mold (not shown) and then a liquid or semi-liquid optically transmissive plastic material is injected into the mold. During the molding of the OSA 300, the apertures 366 allow the plastic material to flow through the apertures 366 to all portions of the mold without materially impeding the flow of plastic. The apertures 366 thus allow the first disk 354 to be partially embedded in the flange 306, the second disk 356 to be partially embedded in the receptacle 302, and the base 352 to be partially embedded in the neck 304. A portion of the plastic material also remains positioned within the apertures 366 after the molding of the example OSA 300. The size shape, orientation, location, and number of apertures 366 defined in the EMR shield 350 can be adjusted according to a variety of factors including, but not limited to, those disclosed elsewhere herein.

With reference again to FIGS. 3A and 3B, a portion of the base 352 of the example EMR shield 350 extends beyond the outside perimeter of the neck 304 of the OSA 300. This portion of the base 352 that extends beyond the outside perimeter of the neck 304 can electrically communicate with a grounded housing of an optoelectronic module (not shown) into which the OSA 300 is integrated, in a similar manner as discussed above in connection with the OSA 200. This grounding contact with the housing can further enhance the effectiveness of the EMR shield 350.

Figure 3F:
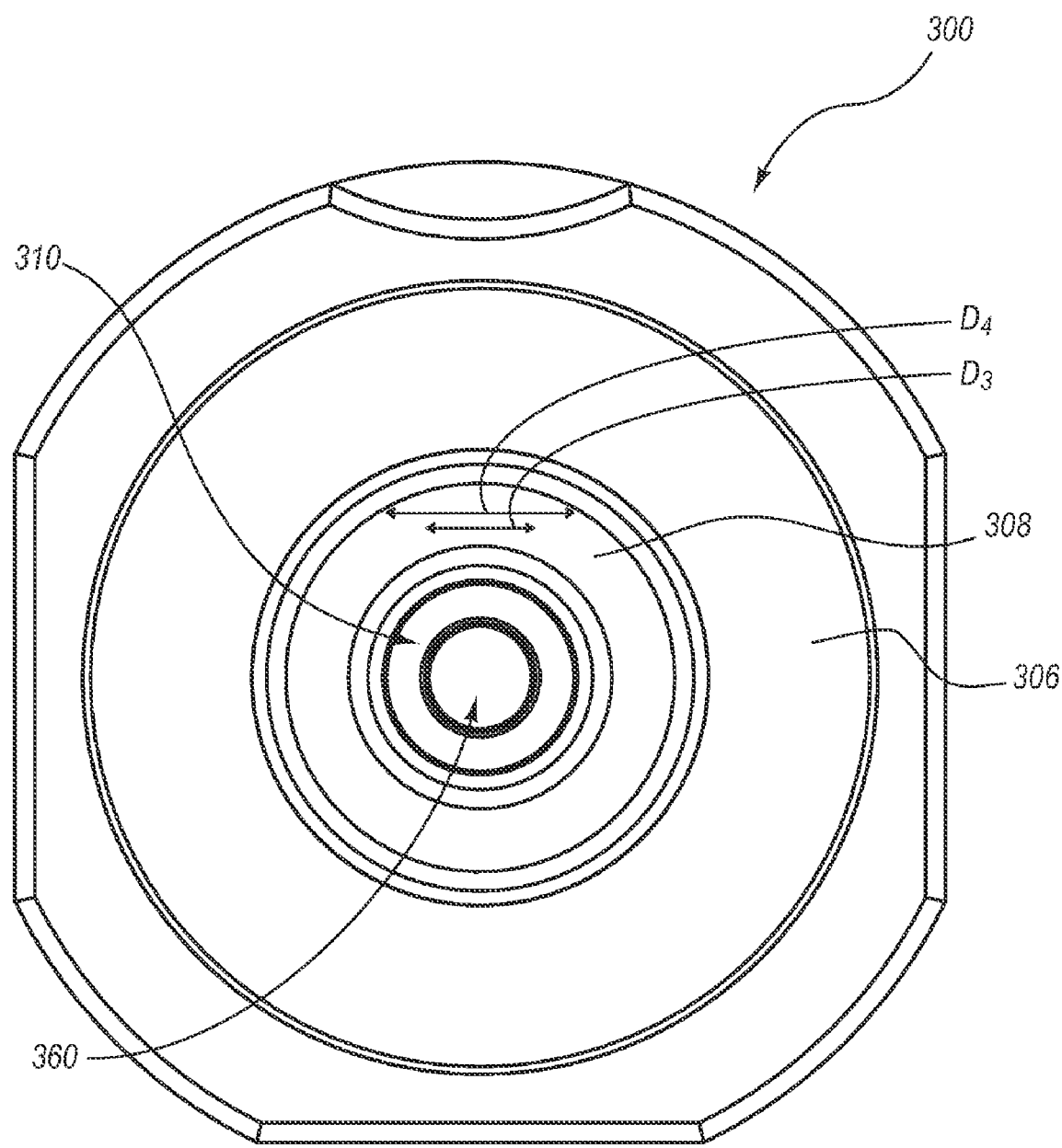
FIG. 3F is a front view of the example OSA of FIGS. 3A and 3B.

As disclosed in FIG. 3F, the opening 360 through the EMR shield 350 has a diameter $D_3$ and the cavity 310 of the OSA 300 has a diameter $D_4$. In the example embodiment disclosed in FIG. 3F, the diameter $D_3$ of the opening 360 of the EMR shield 350 is smaller than the diameter $D_4$ of the cavity 310 of the OSA 300. The relatively smaller size of the diameter $D_3$ of the opening 360 can increase the effectiveness of the EMR shield 350 by effecting a relative reduction in the amount of EMR that can escape through the cavity 310 of the OSA 300. The relatively smaller size of the diameter $D_3$ of the opening 360 can also increase the effectiveness of the EMR shield 350 by effecting a relative reduction in the amount of EMR that can enter the OSA 300 through the cavity 310.

The example EMR shields disclosed herein can therefore aid in the control of the amount of EMR that passes through OSAs into which the EMR shields are integrated. OSAs that include these EMR shields can, in turn, be effective at limiting the transmission of EMR out of and/or into optoelectronic modules into which the OSAs are integrated. These example OSAs can be effective at limiting the transmission of EMR while avoiding the difficulties and costs associated with coating OSAs with metal or forming OSAs from metal.

The example embodiments disclosed herein may be embodied in other specific forms. The example embodiments disclosed herein are to be considered in all respects only as illustrative and not restrictive.

What is claimed is:

1. An EMR shield comprising:
    a base defining a plurality of apertures;
    first and second disks extending from the base, each disk defining a plurality of apertures, an outside perimeter of the first disk being approximately the same as that of a flange of an associated OSA; and
    an opening defined by and extending through the first disk, the base, and the second disk.

2. The EMIR shield as recited in claim 1, wherein the base, the first disk, and the second disk are composite components formed from identical top and bottom pieces that comprise stamped stainless steel sheet metal.

3. An OSA comprising:
    a receptacle;
    a neck extending from the receptacle;
    a flange extending from the neck;
    a barrel extending from the flange, the barrel defining a cavity, the cavity having a diameter; and
    the EMR shield as recited in claim 1, wherein the first disk is at least partially embedded in the flange, the second disk is at least partially embedded in the receptacle, the base is at least partially embedded in the neck, and a diameter of the opening is smaller than the diameter of the cavity.

4. The OSA as recited in claim 3, wherein the receptacle, neck, flange, and barrel comprise an injected optically transmissive plastic material, wherein a portion of the plastic material is positioned within the apertures.

5. The OSA as recited in claim 3, further comprising an indentation defined in the first disk.

6. The OSA as recited in claim 5, wherein an innermost end of the cavity extends beyond the barrel into the flange and the indentation is positioned proximate the innermost end of the cavity.

7. An optoelectronic module comprising:
    a housing;
    a printed circuit board (PCB) at least partially positioned within the housing; and
    the OSA as recited in claim 1 at least partially positioned within the housing and electrically connected to the PCB, the OSA further comprising a transducer housed in the receptacle.

8. The optoelectronic module as recited in claim 7, wherein the optoelectronic module has a form factor that is substantially compliant with one or the following MSAs: SFF, SFP, XFP, XPAK, X2, or XENPAK.

* * * * *